United States Patent
Kim (10) Patent No.: US 8,213,235 B2
(45) Date of Patent: Jul. 3, 2012

(54) NONVOLATILE MEMORY DEVICE (75) Inventor: Jee Yul Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 206 days.

(21) Appl. No.: 12/796,059

(22) Filed: Jun. 8, 2010

(65) Prior Publication Data

US 2010/0329047 A1 Dec. 30, 2010

(30) Foreign Application Priority Data

Jun. 29, 2009 (KR) ........................ 10-2009-0058479

(51) Int. Cl.
*G11C 11/34* (2006.01)
*G11C 8/00* (2006.01)
(52) U.S. Cl. ............................... 365/185.23; 365/230.06
(58) Field of Classification Search ............. 365/185.23, 365/185.17, 230.06
See application file for complete search history.

(56) References Cited

U.S. PATENT DOCUMENTS

| | | | |
|---|---|---|---|
| 6,545,910 B2 * | 4/2003 | Byeon et al. | 365/185.17 |
| 7,180,786 B2 * | 2/2007 | Mastrangelo et al. | 365/185.23 |
| 7,646,640 B2 * | 1/2010 | Ryu et al. | 365/185.11 |
| 2007/0279999 A1 * | 12/2007 | Watanabe et al. | 365/185.23 |

FOREIGN PATENT DOCUMENTS

KR  100781041  11/2007

OTHER PUBLICATIONS

Notice of Preliminary Rejection issued from Korean Intellectual Property Office on Dec. 8, 2010.

* cited by examiner

*Primary Examiner* — Anh Phung
(74) *Attorney, Agent, or Firm* — IP & T Group LLP (57) ABSTRACT

A nonvolatile memory device, including an X decoder coupling global lines to respective word lines to which memory cells are coupled, a voltage supply unit comprising voltage selection circuits corresponding to the respective global lines and configured to generate operating voltages, wherein each of the voltage selection circuits latches control signals, each determined according to a corresponding line enable signal and a corresponding voltage control signal, and selects and supplies one of the operating voltages in response to the control signals, and a control unit supplying a number of the line enable signals and a number of the voltage control signals to the voltage supply unit.

6 Claims, 7 Drawing Sheets

NONVOLATILE MEMORY DEVICE

CROSS-REFERENCE TO RELATED APPLICATION

Priority to Korean patent application number 10-2009-0058479 filed on Jun. 29, 2009, the entire disclosure of which is incorporated by reference herein, is claimed.

BACKGROUND

Exemplary embodiments relate to a nonvolatile memory device.

A nonvolatile memory device has the advantages of random access memory (RAM), such as enabling the writing and erasure of data, and read only memory (ROM), such as retaining data even without the supply of power, and so has recently been widely used for the storage media of portable electronic devices, such as digital cameras, personal digital assistants (PDAs), and MP3 players.

The memory cells of a nonvolatile memory device may be coupled to word lines WL and bit lines BL. A memory cell coupled to a selected word line and a selected bit line may be selected, and data may be programmed into the selected memory cell or data stored in the selected memory cell may be read.

In general, a program operation is performed on the nonvolatile memory device by supplying a program voltage to a word line of a plurality of word lines, selected for a program, and supplying a pass voltage to the remaining unselected word lines.

To supply the program voltage or the pass voltage to each of the word lines, the corresponding word line may be coupled to a global word line GWL through which the voltage is supplied. Each of the global word lines GWL may be coupled to a voltage supply unit, which supplies the necessary voltage.

Furthermore, the voltages supplied to the global word lines GWL may be determined in response to a control signal inputted to a control unit for controlling the operations of the nonvolatile memory device. That is, a program voltage may be supplied to a global word line GWL coupled to a word line selected for a program, and a pass voltage may be supplied to global word lines GWL coupled to the remaining word lines. To this end, the control unit may control the voltage supply unit so that it generates a variety of voltages, supplies the variety of voltages to the respective global word lines GWL, and also selects and outputs a voltage required by each of the global word lines GWL.

Meanwhile, in the program operation of the nonvolatile memory device, a local self-boosting method of supplying several levels of voltage may be used so that the threshold voltages of peripheral memory cells, which are not selected to be programmed, are not changed.

Accordingly, various kinds of voltages may be supplied to the global word lines GWL for supplying the operating voltages to the word lines WL, and therefore, the number of control signals that should be output by the control unit in order to set up the kinds of voltages for the respective global word lines GWL may be great. Accordingly, the number of control lines for supplying the control signals may be great.

The number of control lines t necessary to control the voltage is shown in the following equation 1.

$t$=Number of planes×Number of word lines×Number of voltage levels  [Equation 1]

For example, it is assumed that a nonvolatile memory device includes two planes, each of the planes includes a plurality of memory blocks, each of the memory blocks includes 32 word lines, and the number of voltage levels of an operating voltage for a program, read, or erase operation is 5. In this case, t=2×32×5=320.

According to Equation 1, the number of control lines t is the number of planes×the number of word lines×the number of voltage levels. Therefore, a small increase in either the number of word lines, the number of voltage levels, or the number of planes, may result in a relatively large increase in the number of control lines. For example, if the number of word lines is increased in order to increase the capacity of a nonvolatile memory device and the number of voltage levels of operating voltages is increased in order to improve the operation, the number of control lines is also increased. And if the number of control lines is increased, the area occupied by the control lines in the layout of the nonvolatile memory device is also increased.

BRIEF SUMMARY

Exemplary embodiments relate to a nonvolatile memory device capable of reducing the area of a circuit and the size of a memory device by reducing the number of lines of a control circuit for controlling the voltage levels of operating voltages supplied to global lines.

A nonvolatile memory device according to an aspect of the present disclosure includes an X decoder, a voltage supply unit, and a control unit. The X decoder is configured to couple global lines to respective word lines to which memory cells are coupled. The voltage supply unit is configured to comprise voltage selection circuits corresponding to the respective global lines and generate operating voltages. Each of the voltage selection circuits latches control signals, which are each determined according to a corresponding line enable signal and a corresponding voltage control signal, and selects and supplies one of the operating voltages to be supplied to the global lines in response to the control signals. The control unit is configured to supply a number of the line enable signals and a number of the voltage control signals to the voltage supply unit.

The voltage supply unit may include a number of control signal set-up units configured to latch the respective control signals for determining the operating voltages based on the respective line enable signals and the voltage control signals, and a number of voltage selection units configured to select and supply the operating voltages to be supplied to the respective global lines based on the control signals respectively latched in the control signal set-up units.

Each of the control signal set-up units may include a selection control signal output unit configured to output a selection control signal for selecting a voltage based on logic levels of the line enable signal and the voltage control signal, and a latch unit configured to latch the control signal.

Each of the voltage selection units may include a number of voltage output units for outputting the operating voltages in response to the respective control signals.

The control unit may output the line enable signals and the voltage control signals based on an address received together with an operation command.

DESCRIPTION OF EMBODIMENT

Hereinafter, exemplary embodiments of the present disclosure will be described in detail with reference to the accompanying drawings. The figures are provided to allow those having ordinary skill in the art to understand the scope of the embodiments of the disclosure.

Figure 1:
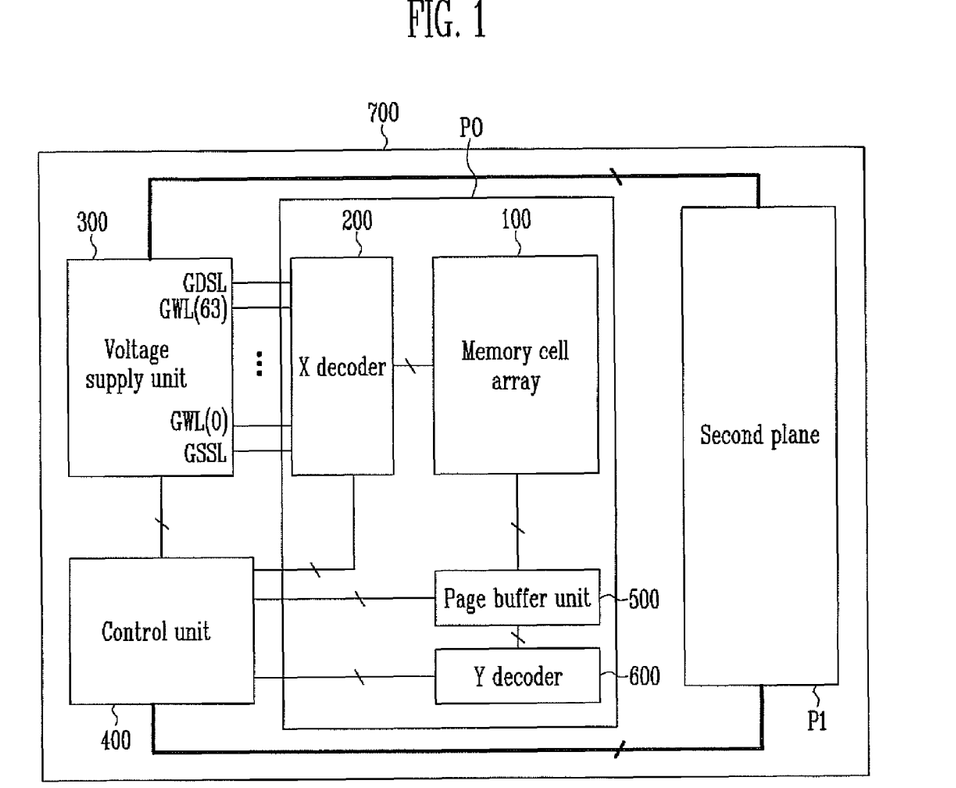
FIG. 1 is a block diagram showing a nonvolatile memory device according to an embodiment of this disclosure.

FIG. 1 is a block diagram showing a nonvolatile memory device according to an embodiment of this disclosure.

Referring to FIG. 1, the nonvolatile memory device 700 includes a first plane P0, a second plane P1, a voltage supply unit 300, and a control unit 400.

The first and second planes P0, P1 have the same construction, and so only the construction of the first plane P0 is shown in FIG. 1. Hereinafter, only the construction of the first plane P0 is described as an example.

The first plane P0 includes a memory cell array 100, an X decoder 200, a page buffer unit 500, and a Y decoder 600.

The memory cell array 100 includes a number of memory blocks 110. Each of the memory blocks 110 includes a number of memory cells coupled to a number of word lines and a number of bit lines, and is configured to store data.

The X decoder 200 selects one of the memory blocks based on an input address, and couples the word lines of the selected memory block and global word lines GWL<0> to GWL<63> through which operating voltages are supplied together. The X decoder also couples a drain select line and a source select line of the selected memory block with a global drain selection line GDSL and a global source selection line GSSL, respectively.

The voltage supply unit 300 generates operating voltages and supplies them to the global word lines GWL<0> to GWL<63>, the global drain selection line GDSL, and the global source selection line GSSL. The control unit 400 generates control signals for controlling the program, verification, erase, and read operations of the nonvolatile memory device 700.

The page buffer unit 500 includes a number of page buffers, each coupled to one or more of the bit lines of the memory cell array 100. Each of the page buffers latches data to be programmed into a selected memory cell or latches data read from a selected memory cell.

The Y decoder 600 provides a data IO path to the page buffers in response to a control signal, generated by the control unit 400, based on an input address.

A connection relationship between the X decoder 200 and the memory blocks of the memory cell array 100 is described below.

Figure 2:
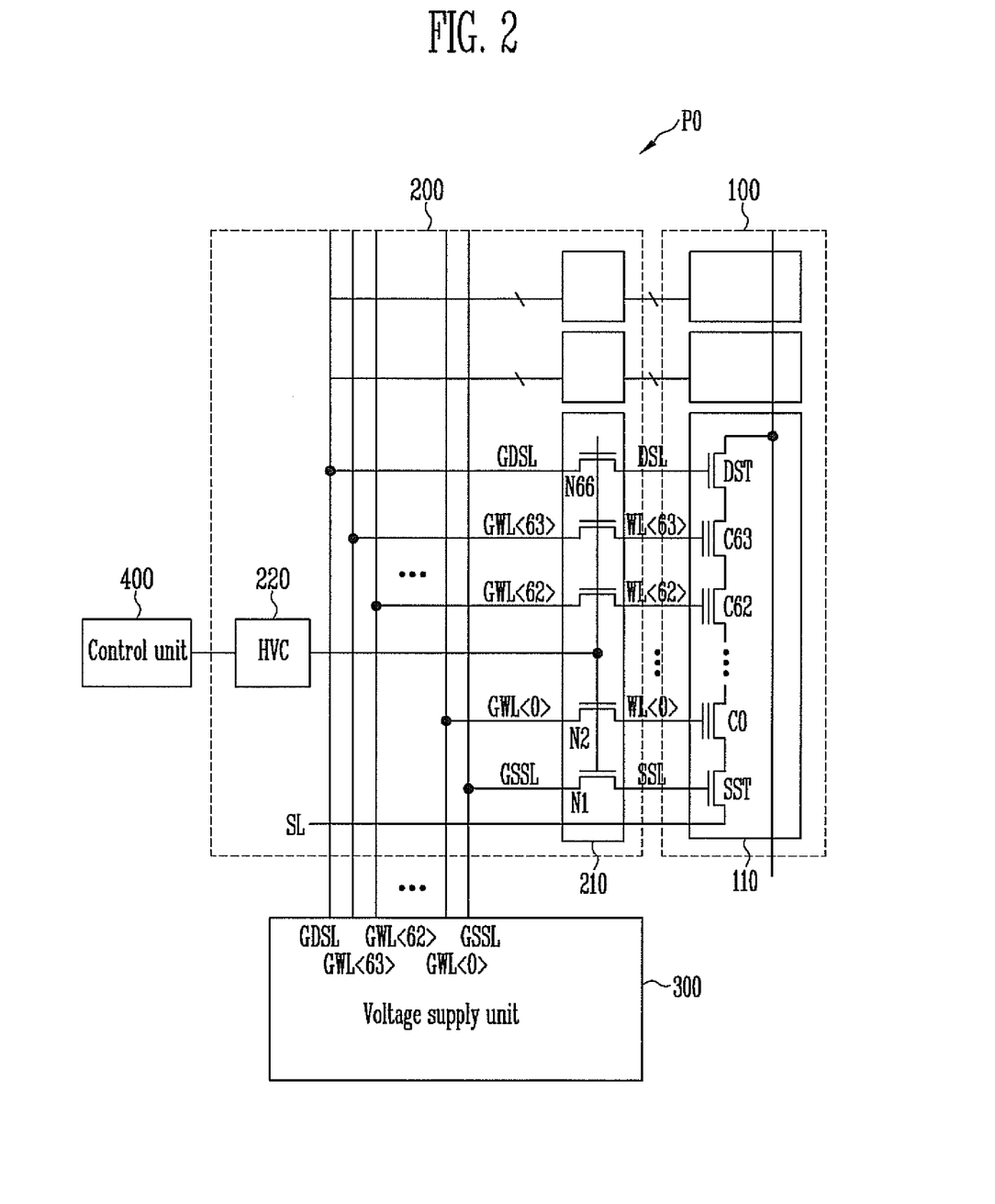
FIG. 2 illustrates a connection relationship between a memory cell array and an X decoder shown in FIG. 1.

FIG. 2 illustrates a connection relationship between the memory cell array 100 and the X decoder 200 shown in FIG. 1.

In FIG. 2, only one of a plurality of cell strings, included in one of the memory blocks 110 of the memory cell array 100, are shown. FIG. 2 also shows part of a block switch unit 210 for selecting the corresponding memory block 110 and coupling it to the global word lines GWL<0> to GWL<63>, the global drain selection line GDSL, and the global source selection line GSSL.

The memory block 110 includes a number of the cell strings, however, only one of the cell strings is shown as an example for sake of convenience.

Each cell string includes first to sixty-fourth memory cells C0 to C63 coupled in series between a drain select transistor DST and a source select transistor SST.

The gates of the drain select transistors DST of the cell strings are commonly coupled to a drain selection line DSL, and the gates of the source select transistors SST are commonly coupled to a source selection line SSL.

The gates of the first to sixty-fourth memory cells C0 to C63 are respectively coupled to first to sixty-fourth word lines WL<0> to WL<63>.

The block switch unit 210 includes first to sixty-sixth NMOS transistors N1 to N66. The first NMOS transistor N1 is coupled between the global source selection line GSSL and the source selection line SSL. The second to sixty-fifth NMOS transistors N2 to N65 are coupled between the respective first to sixty-fourth global word lines GWL<0> to GWL<63> and the respective first to sixty-fourth word lines WL<0> to WL<63>. The sixty-sixth NMOS transistor N66 is coupled between the global drain selection line GDSL and the drain selection line DSL.

A block selection signal, generated by a block selection circuit and a high voltage switch HVC 220, is inputted to the gates of the first to sixty-sixth NMOS transistors N1 to N66. The block selection circuit for controlling the operation of the high voltage switch HVC 220 is not shown for simplicity. The operation of the block selection circuit is controlled by the control unit 400.

As shown in FIG. 2, the drain selection line DSL, the source selection line SSL, and the first to sixty-fourth word lines WL<0> to WL<63> of the memory block 110 are respectively coupled to the global drain selection line GDSL, the global source selection line GSSL, and the global word lines GWL<0> to GWL<63> by the operation of the block switch unit 210.

The global drain selection line GDSL, the global source selection line GSSL, and the first to sixty-fourth global word lines GWL<0> to GWL<63> are coupled to the voltage supply unit 300.

When performing a program operation or a read operation, the nonvolatile memory device 700 supplies the operating voltages, each classified as belonging to one of several voltage levels, through the global lines.

Different operating voltages have to be supplied from the global word lines GWL<0> to GWL<63>, the global drain selection line GDSL, and the global source selection line GSSL to a selected word line, unselected selection word lines, the drain selection line DSL, and the source selection line SSL.

To this end, the voltage supply unit 300 includes the following voltage control circuit.

Figure 3A:
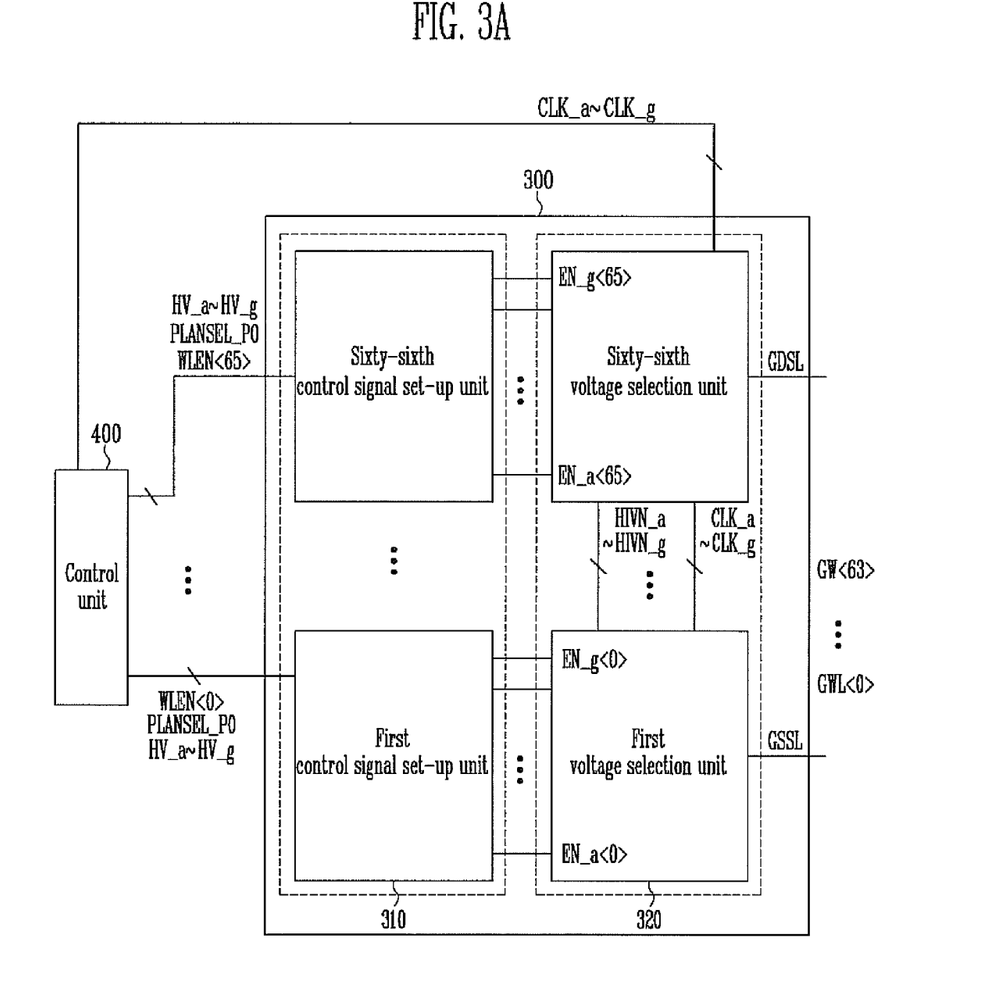
FIG. 3A is a block diagram of a voltage control circuit within a voltage supply unit shown in FIG. 1.

FIG. 3A shows the voltage control circuit of the voltage supply unit 300 shown in FIG. 1.

Referring to FIG. 3A, the voltage control circuit of the voltage supply unit 300 is divided into a control signal set-up block and a voltage selection block. The control signal set-up block includes first to sixty-sixth control signal set-up units 310. The voltage selection block includes first to sixty-sixth voltage selection units 320. The first to sixty-sixth control signal set-up units 310 have the same circuit construction, and the first to sixty-sixth voltage selection units 320 have the same circuit construction. Accordingly, reference numerals are assigned to only the first control signal set-up unit 310 and the first voltage selection unit 320.

The first to sixty-sixth control signal set-up units 310 supply the control signals to the first to sixty-sixth voltage selection units 320, respectively. The first to sixty-sixth voltage selection units 320 select respective operating voltages to be supplied to the global lines in response to the respective control signals from the first to sixty-sixth control signal set-up units 310.

The first voltage selection unit 320 selects an operating voltage to be supplied to the global source selection line GSSL. The second to sixty-fifth voltage selection units select respective operating voltages to be supplied to the first to sixty-fourth global word lines GWL<0> to GWL<63>. The sixty-sixth voltage selection unit selects the operating voltage to be supplied to the global drain selection line GDSL.

The first control signal set-up unit 310 and the first voltage selection unit 320 are described in more detail below.

Figure 3B:
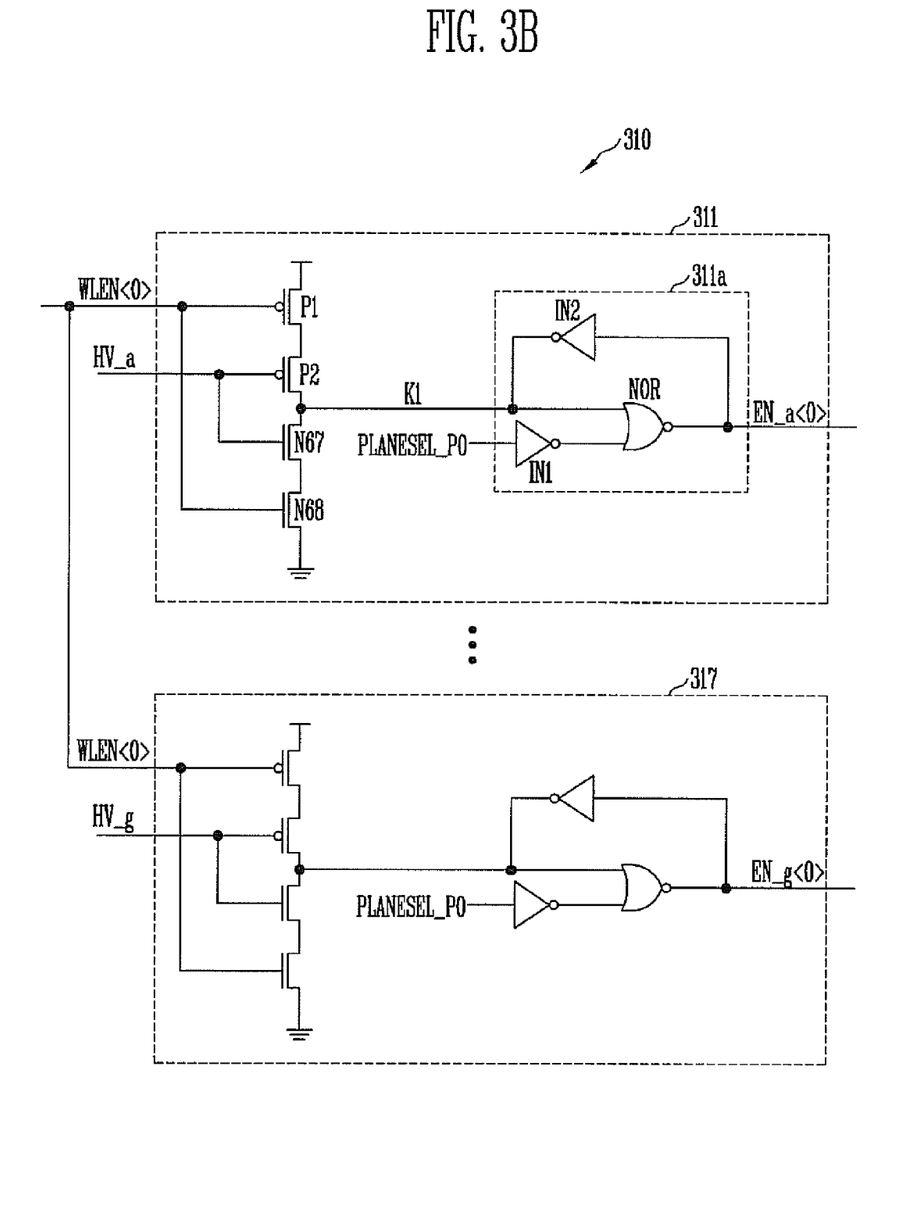
FIG. 3B is a circuit diagram of a first control signal set-up unit shown in FIG. 3A.

FIG. 3B is a circuit diagram of the first control signal set-up unit 310 shown in FIG. 3A.

Referring to FIG. 3B, the first control signal set-up unit 310 includes first to seventh set-up units 311 to 317. The first to seventh set-up units 311 to 317 output first to seventh control signals EN_a<0> to EN_g<0>, respectively. The first to seventh set-up units 311 to 317 have the same construction, and therefore, only the first set-up unit 311 is described as an example for sake of convenience.

The first set-up unit 311 includes first and second PMOS transistors P1, P2, sixty-seventh and sixth-eighth NMOS transistors N67, N68, first and second inverters IN1, IN2, and a NOR gate NOR.

The first and second PMOS transistors P1, P2 and the sixty-seventh and sixty-eighth NMOS transistors N67, N68 are coupled in series between a power supply voltage terminal and a ground node.

A first line enable signal WLEN<0> is inputted to the gates of the first PMOS transistor P1 and the sixty-eighth NMOS transistor N68. A first voltage control signal HV_a is inputted to the gates of the second PMOS transistor P2 and the sixty-seventh NMOS transistor N67.

The first line enable signal WLEN<0> is a control signal generated by the control unit 400 and is enabled to set up voltage supplied to the global source selection line GSSL.

The control unit 400 generates the first to sixty-sixth line enable signals WLEN<0:65>. The second to sixty-fifth line enable signals WLEN<1:64> are enabled to set up respective voltages supplied to the first to sixty-fourth global word lines GWL<0> to GWL<63>. The sixty-sixth line enable signal WLEN<65> is enabled to set up voltage supplied to the global drain selection line GDSL.

Meanwhile, a node K1 of the second PMOS transistor P2 and the sixty-seventh NMOS transistor N67 is coupled to a first input terminal of the NOR gate NOR.

The output signal of the first inverter IN1 is inputted to the second input terminal of the NOR gate NOR. The first inverter IN1 inverts a first plane selection signal PLANESEL_P0 and outputs an inverted signal.

The output signal of the NOR gate NOR is the first control signal EN_a<0> of the first line. The second inverter IN2 is coupled between the node K1 and the output terminal of the NOR gate NOR.

The first and second inverters IN1, IN2 and the NOR gate NOR collectively play the role of a latch circuit 311a for latching data received through the node K1 during the time for which the first plane selection signal PLANESEL_P0 of a high logic level is supplied.

The first to seventh set-up units 311 to 317 latch the first to seventh control signals EN_a<0> to EN_g<0>, respectively, and output the results.

Next, an exemplary operation of the first control signal set-up unit 310 is explained. For sake of convenience, the operation is explained only with reference to the first set-up unit 311.

When the first voltage control signal HV_a of a high logic level is received with the first line enable signal WLEN<0> having a high logic level, the node K1 is coupled to a ground voltage.

Further, when the first plane selection signal PLANESEL_P0 of a high logic level is inputted to the first inverter IN1, a signal of a low level is supplied to the NOR gate NOR. Accordingly, the signal of a low logic level is inputted to the first and second input terminals of the NOR gate NOR. The NOR gate NOR performs a NOR operation on the two signals of a low level and outputs a result as a signal of a high logic level.

When the output signal of the NOR gate NOR is in a high logic level with the first plane selection signal PLANESEL_P0 having a high logic level, the second inverter IN2 inverts the output signal of the NOR gate NOR, and so a signal of a low logic level is inputted to the first input terminal of the NOR gate NOR. Thus, in the state in which the first line enable signal WLEN<0> and the first control signal HV_a are no longer inputted, the NOR gate NOR continues to output a signal of a high logic level.

The first voltage selection unit 320 then selects a voltage to be supplied to the global source selection line GSSL in response to the first to seventh control signals EN_a<0> to EN_g<0>.

Figure 3C:
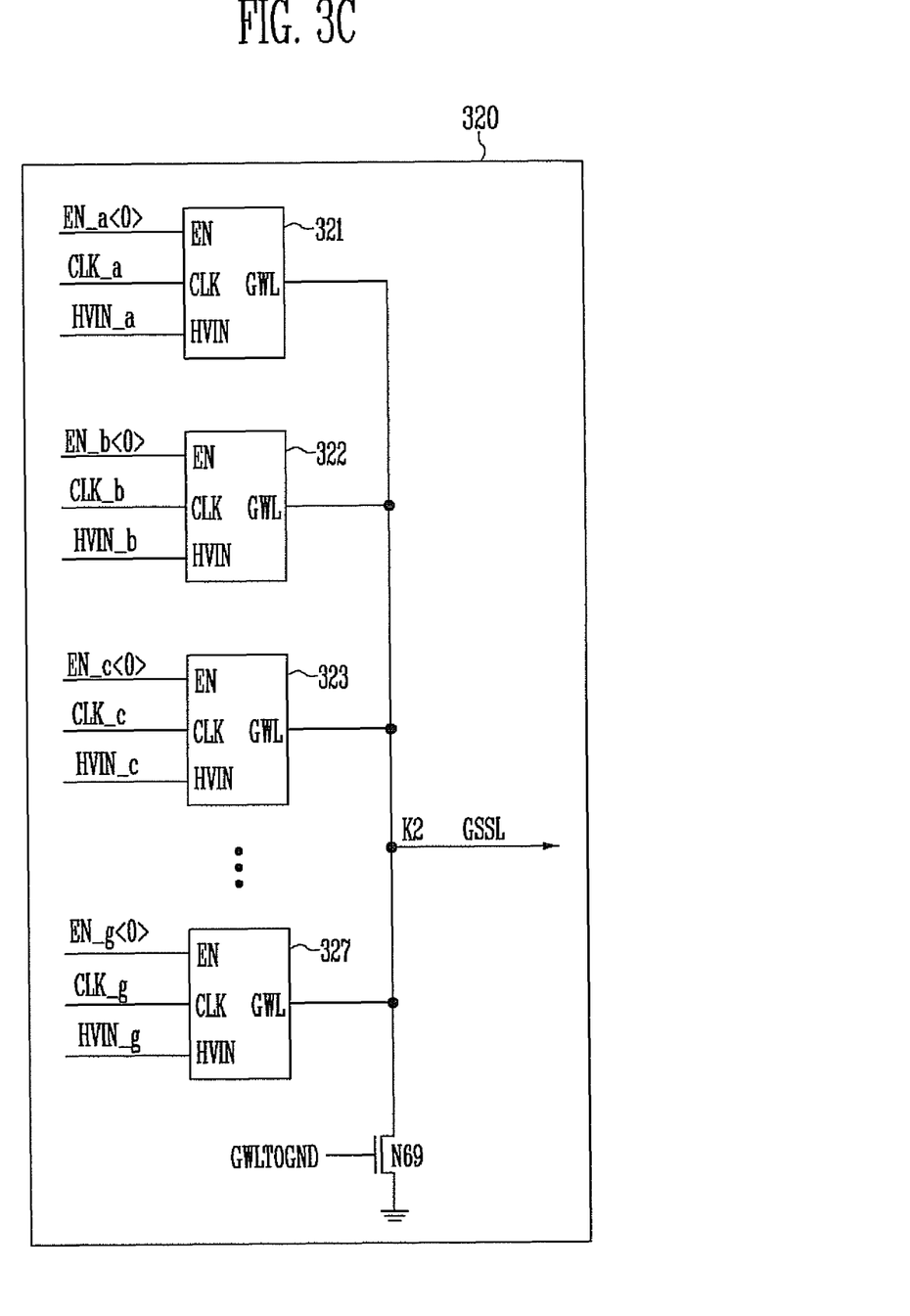
FIG. 3C is a circuit diagram of a first voltage selection unit shown in FIG. 3A.

FIG. 3C shows the first voltage selection unit 320 shown in FIG. 3A.

Referring to FIG. 3C, the first voltage selection unit 320 includes first to seventh voltage selectors 321 to 327 and a sixty-ninth NMOS transistor N69.

The sixty-ninth NMOS transistor N69 is coupled between a node K2 and a ground voltage. Moreover, the sixty-ninth NMOS transistor is configured to receive a global word line-to-ground control signal GWLTOGND at its gate.

The first to seventh voltage selectors 321 to 327 supply first to seventh voltages HVIN_a to HVIN_g, respectively, to the global source selection line GSSL in response to the first to seventh control signals EN_a<0> to EN_g<0> supplied from the first control signal set-up unit 310. Here, only one of the first to seventh voltage selectors 321 to 327 is enabled to supply the first to seventh voltages HVIN_a to HVIN_g to the global source selection line GSSL.

The first to seventh voltage selectors 321 to 327 have the same operation. As a representative example, the first selection unit 321 has an enable terminal EN to which the first control signal EN_a<0> of the first line is inputted, a clock terminal CLK to which a first clock signal CLK_a is inputted, and a voltage input terminal HVIN to which the first voltage HVIN_a is inputted.

When the first control signal EN_a<0> has a high logic level, the first selection unit 321 outputs the first voltage HVIN_a in response to the first clock signal CLK_a. The first voltage HVIN_a is supplied to a node K2 which is coupled to the global source selection line GSSL.

In the case in which the first and second planes P0, P1 are not operated at the same time, the first and second planes may share the X decoder 200, the page buffer unit 500, and the Y decoder 600. However, the nonvolatile memory device 700 according to the embodiment of this disclosure can be operated to issue a multi-plane command for selecting and operating the first and second planes P0, P1 at the same time. To this end, each of the first and second planes P0, P1 needs to include the X decoder 200, the page buffer unit 500, and the Y decoder 600.

The control signals for controlling the voltage control circuit for supplying the global word lines with the voltages generated by the voltage supply unit 300 are generated by the control unit 400.

Figure 4:
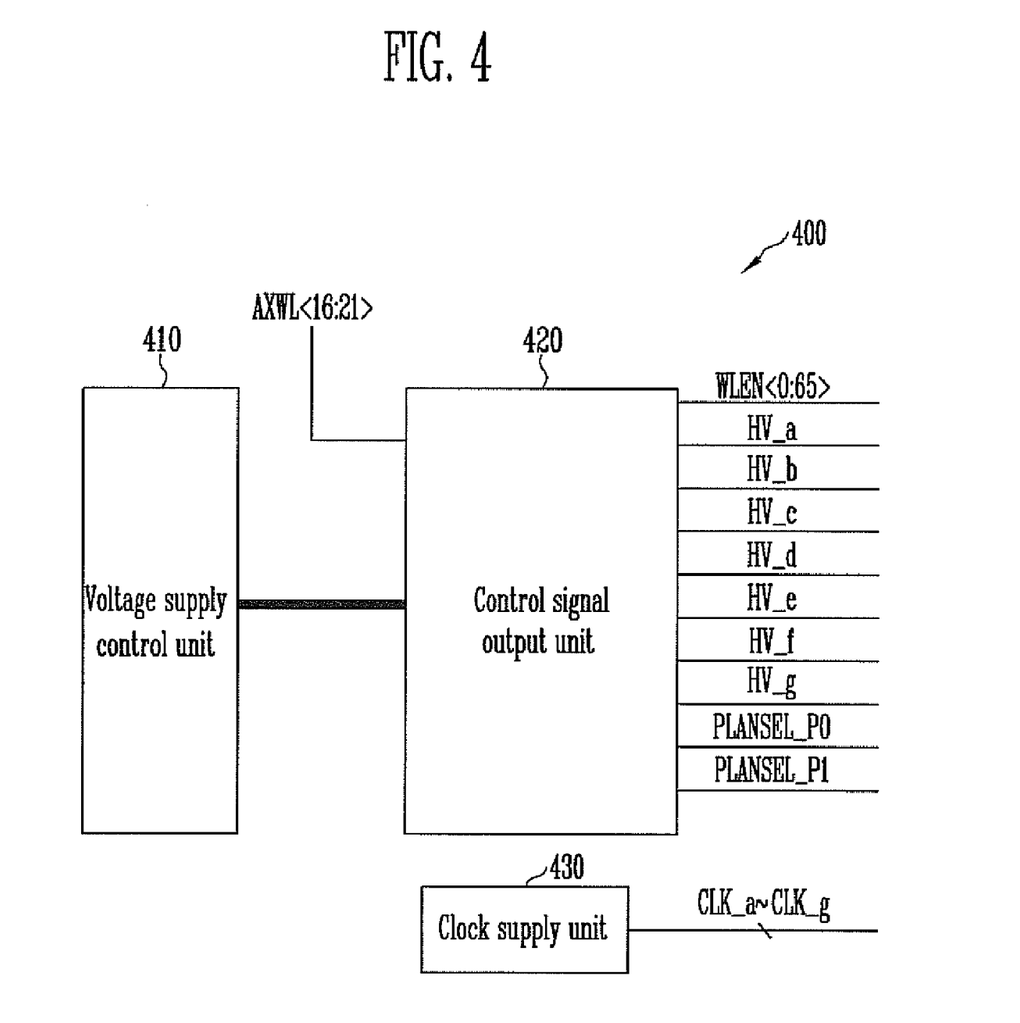
FIG. 4 is a block diagram showing a control unit shown in FIG. 1.

FIG. 4 is a block diagram showing the control unit 400 shown in FIG. 1.

Referring to FIG. 4, the control unit 400 includes a voltage supply control unit 410, a control signal output unit 420, and a clock supply unit 430. In FIG. 4, there is shown only part of the control unit 400 for outputting the control signals for supplying the global word lines with the voltages generated by the voltage supply unit 300.

The voltage supply control unit 410 generates the control signals relating to which voltages will be supplied to the first to sixty-fourth word lines WL<0> to WL<63> based on a program operation. The control signal output unit 420 generates the first to sixty-sixth line enable signals WLEN<0:65> and the first to seventh voltage control signals HV_a to HV_g in response to the control signals generated by the voltage supply control unit 410. The control signal output unit 420 also generates the first and second plane selection signals PLANESEL_P0, PLANESEL_P1.

The clock supply unit 430 generates the first to seventh clock signals CLK_a to CLK_g to be inputted to each of the first to sixty-sixth voltage selection units.

The first to sixty-sixth line enable signals WLEN<0:65> generated by the control signal output unit 420 are supplied in response to address signals AXWL<16:21>.

The operation of the nonvolatile memory device 700 constructed as above is described below with reference to FIG. 5.

Figure 5:
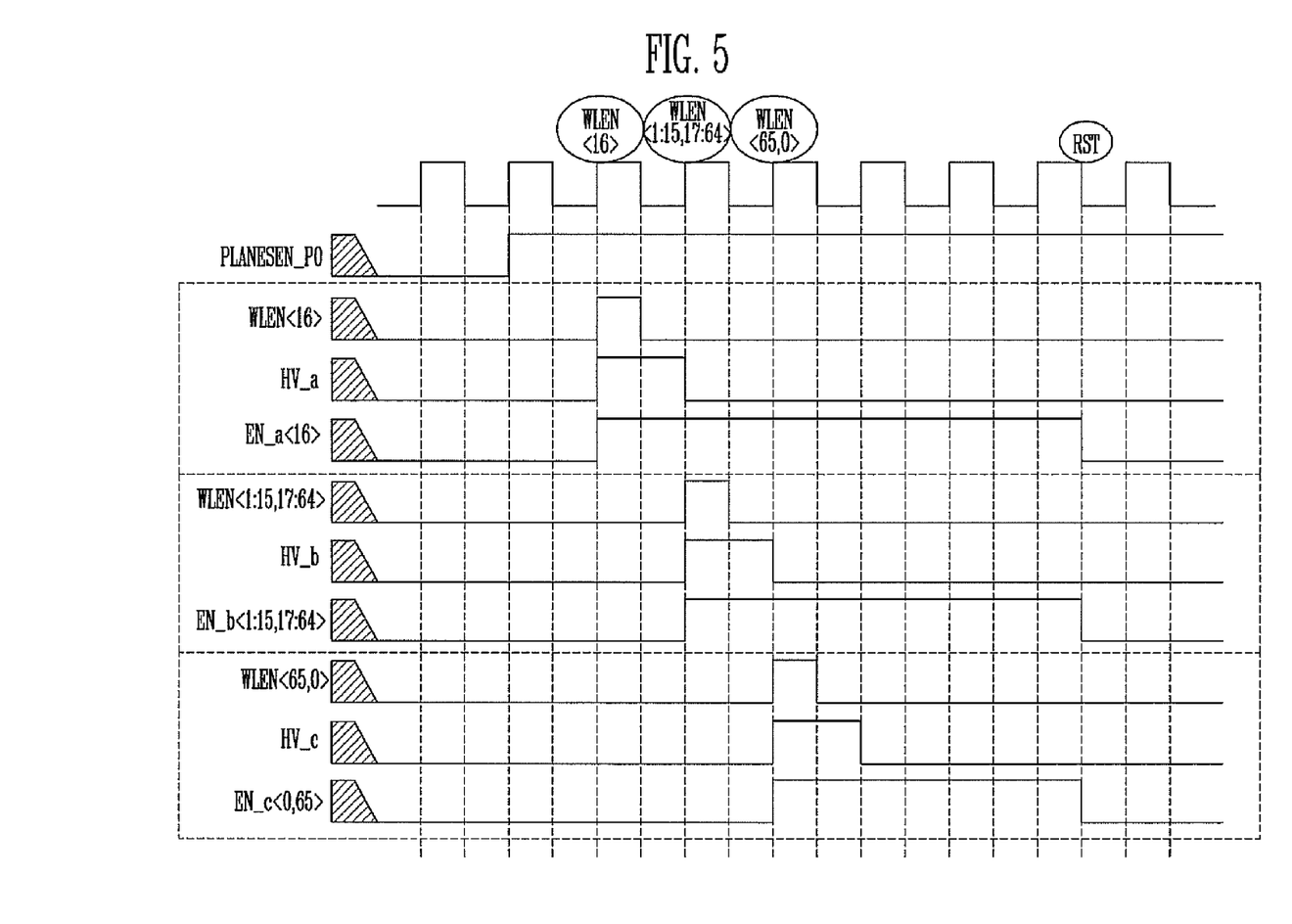
FIG. 5 is a timing diagram illustrating an operation of setting up a program voltage according to an embodiment of the present invention.

FIG. 5 is a timing diagram illustrating an operation of setting up a program voltage according to an embodiment of the present invention.

It is first assumed that a program command is inputted to the nonvolatile memory device 700 and a seventeenth word line WL<16> is selected and supplied with a program voltage.

Referring to FIG. 5, the first to third voltages HVIN_a to HVIN_c are supplied during a program operation. Herein, the first voltage HVIN_a is the program voltage, the second voltage HVIN_b is a pass voltage, and the third voltage HVIN_c is supplied to the source selection line SSL and the drain selection line DSL.

Thus, the third voltage HVIN_c should be supplied to the global source selection line GSSL and the global drain selection line GDSL. The second voltage HVIN_b should be supplied to the first to sixteenth global word lines GWL<0> to GWL<15> and the eighteenth to sixty-fourth global word lines GWL<17> to GWL<63>. Furthermore, the first voltage HVIN_a should be supplied to the seventeenth global word line GWL<16>.

During the time for which the first voltage control signal HV_a is in a high logic level, the control signal output unit 420 supplies the eighteenth line enable signal WLEN<17> of a high logic level to the eighteenth control signal set-up unit, so that the seventeenth global word line GWL<16> may receive the first voltage HVIN_a.

During the time in which the eighteenth line enable signal WLEN<17> of a high logic level and the first voltage control signal HV_a of a high logic level are supplied, the eighteenth control signal set-up unit outputs the first control signal EN_a<17> having a high logic level. In response thereto, the eighteenth voltage selection unit supplies the seventeenth global word line GWL<16> with the first voltage HVIN_a. The seventeenth global word line GWL<16> is coupled to the seventeenth word line WL<16>.

During the time in which the second voltage control signal HV_b has a high logic level, the control signal output unit 420 generates the second to seventeenth line enable signals WLEN<1> to WLEN<16> and the nineteenth to sixty-fifth line enable signals WLEN<18> to WLEN<64> of a high logic level, so that the second voltage HVIN_b is supplied to each of the first to sixteenth global word lines GWL<0> to GWL<15> and each of the eighteenth to sixty-fourth global word lines GWL<17> to GWL<63>.

During the time in which the third voltage control signal HV_c has a high logic level, the control signal output unit 420 generates the first and sixty-sixth line enable signals WLEN<0> and WLEN<65> of a high logic level, so that the third voltage HVIN_c is supplied to both the global source selection line GSSL and the global drain selection line GDSL.

In the case in which the control unit 400 and the voltage supply unit 300 are configured as shown in FIGS. 3A to 3C and 4, if the number of word lines and the number of operating voltages are increased, relatively few additional voltage lines are required because the control unit 400 only has to output a signal according to the increased number of operating voltages and the increased number of word lines. That is, the number of lines t for signals outputted by the control unit 400 is determined as follows.

$$t = \text{Number of planes} + \text{Number of word lines of memory block} + \text{Number of voltage levels} \quad \text{[Equation 2]}$$

Thus, given the embodiment shown in FIGS. 3A to 3C and 4, t=2+66+7=75.

As shown in Equation 2, the number of lines for signals output by the control unit 400 is 75. If one plane (i.e., a second plane (not shown)) is added, the number of signal lines t is 76. Thus, only a plane selection signal for the added plane has to be added. Likewise, in the case in which the number of word lines of the memory block is increased, signal lines have only to be increased by the increased number of word lines.

The reason why the number of signal lines is not significantly increased is that the first control signal set-up unit 310 includes the latch circuit 311a, such as that shown in FIG. 3B. The latch circuit 311a latches a control signal for each set-up voltage before finally selecting a voltage to be supplied to the global lines using the control signal.

As described above, according to the nonvolatile memory device in accordance with this disclosure, the number of signal lines required in a circuit for selecting the operating voltages and supplying them to the global lines can be reduced. Accordingly, the entire area of the circuit of a nonvolatile memory device can be reduced.

What is claimed is:
1. A nonvolatile memory device, comprising:
    an X decoder configured to couple global lines to respective word lines to which memory cells are coupled;
    a voltage supply unit comprising voltage selection circuits corresponding to the respective global lines and configured to generate operating voltages, wherein each of the voltage selection circuits latches control signals, each determined according to a corresponding line enable signal and a corresponding voltage control signal, and selects and supplies one of the operating voltages in response to the control signals; and a control unit configured to supply a number of the line enable signals and a number of the voltage control signals to the voltage supply unit.

2. The nonvolatile memory device of claim 1, wherein the voltage supply unit comprises:
a number of control signal set-up units configured to latch the respective control signals for determining the operating voltages based on the respective line enable signals and the voltage control signals; and
a number of voltage selection units configured to select and supply the operating voltages to be supplied to the respective global lines based on the control signals respectively latched in the control signal set-up units.

3. The nonvolatile memory device of claim 2, wherein each of the control signal set-up units comprises:
a selection control signal output unit configured to output a selection control signal for selecting a voltage based on logic levels of the line enable signal and the voltage control signal; and
a latch unit configured to latch the control signal.

4. The nonvolatile memory device of claim 2, wherein each of the voltage selection units comprises a number of voltage output units for outputting the operating voltages in response to the respective control signals.

5. The nonvolatile memory device of claim 1, wherein the control unit outputs the line enable signals and the voltage control signals based on an address received together with an operation command.

6. A nonvolatile memory device, comprising:
an m number of planes each configured to comprise memory blocks each comprising an n number of word lines, where m and n are positive integers;
an X decoder configured to couple the respective n word lines of a memory block, selected for a program, read, or erase operation from among the memory blocks, together with an n number of global lines;
a voltage supply unit configured to generate a k number of operating voltages for the program, read, or erase operation, the voltage supply unit comprising an n number of voltage selection circuits configured to select one of the k number of operating voltages for each of the n number of global lines, where k is a positive integer; and
a control unit configured to supply the voltage supply unit with an m number of plane selection signals for selecting the m number of respective planes, an n number of line enable signals for respectively selecting the n number of global lines, and a k number of voltage control signals for selecting operating voltages to be supplied to the n number of global lines,
wherein the n number of voltage selection circuits are respectively coupled to the n number of global word lines, and
each of the voltage selection circuits is configured to latch a k number of control signals, determined in response to a corresponding one of the n line enable signals, a corresponding one of the m plane selection signals, and a corresponding one of the k number of voltage control signals, and to select one of the k number of operating voltages and supply the selected operating voltage to a corresponding one of the global word lines in response to the k number of control signals.

* * * * *